(12) United States Patent
Dzienis et al.

(10) Patent No.: US 11,531,051 B2
(45) Date of Patent: Dec. 20, 2022

(54) METHOD AND DEVICE FOR IDENTIFYING THE LOCATION OF A FAULT ON A LINE OF AN ELECTRICAL POWER SUPPLY NETWORK

(71) Applicant: Siemens Aktiengesellschaft, Munich (DE)

(72) Inventors: Cezary Dzienis, Dallgow-Doeberitz (DE); Andreas Jurisch, Schwante (DE); Igor Kogan, Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 17/401,564

(22) Filed: Aug. 13, 2021

(65) Prior Publication Data

US 2022/0050134 A1 Feb. 17, 2022

(30) Foreign Application Priority Data

Aug. 13, 2020 (EP) ..................................... 20190886

(51) Int. Cl.
*G01R 31/08* (2020.01)

(52) U.S. Cl.
CPC ......... *G01R 31/086* (2013.01); *G01R 31/083* (2013.01); *G01R 31/085* (2013.01); *G01R 31/088* (2013.01)

(58) Field of Classification Search
CPC .. G01R 31/086; G01R 31/083; G01R 31/085; G01R 31/088; G01R 31/11; G01R 31/08; G01R 19/25; G01R 21/06; H02H 3/042; H02H 7/265; H02H 3/02; G05F 1/10

USPC .......................................................... 324/532
See application file for complete search history.

(56) References Cited

U.S. PATENT DOCUMENTS

| | | | |
|---|---|---|---|
| 4,996,624 A | 2/1991 | Schweitzer, III | |
| 5,929,642 A | 7/1999 | Philippot et al. | |
| 8,655,609 B2 | 2/2014 | Schweitzer, III et al. | |
| 10,277,485 B1* | 4/2019 | Richard | H04L 43/50 |
| 10,598,717 B2 | 3/2020 | Dzienis et al. | |
| 2016/0216311 A1* | 7/2016 | Bazargan | H02H 7/28 |

(Continued)

FOREIGN PATENT DOCUMENTS

| | | |
|---|---|---|
| CN | 106019077 A | 10/2016 |
| CN | 109034467 A | 12/2018 |

(Continued)

*Primary Examiner* — Farhana A Hoque
(74) *Attorney, Agent, or Firm* — Laurence A. Greenberg; Werner H. Stemer; Ralph E. Locher

(57) ABSTRACT

A method identifies a location of a fault on a faulty line of an electrical power supply network having a plurality of lines, a plurality of inner nodes, and at least three outer nodes. The outer nodes each bound a line and are provided with measurement devices which are used to measure high-frequency current and/or voltage signals. To locate faults, one of the outer nodes is selected as the starting node for the search for the fault location. Starting from the starting node, paths to the other outer nodes are determined, and that those paths on which the fault location could be located are selected. A line on which the fault location could be located, in principle, is identified for each of the selected paths using the respective times at which the traveling waves arrive, and a potential fault location is determined for the respectively identified line.

15 Claims, 13 Drawing Sheets

(56) References Cited

U.S. PATENT DOCUMENTS

2018/0120367 A1* 5/2018 Lewis ................. G01R 31/085
2020/0166559 A1 5/2020 Dzienis et al.

FOREIGN PATENT DOCUMENTS

| EP | 3193420 A1 | 7/2017 |
| EP | 3660523 A1 | 6/2020 |
| WO | WO2019186490 A1 | 10/2019 |
| WO | WO2019232595 A1 | 12/2019 |

* cited by examiner

METHOD AND DEVICE FOR IDENTIFYING THE LOCATION OF A FAULT ON A LINE OF AN ELECTRICAL POWER SUPPLY NETWORK

CROSS-REFERENCE TO RELATED APPLICATION

This application claims the priority, under 35 U.S.C. § 119, of European Patent Application EP 20190886.0, filed Aug. 13, 2020; the prior application is herewith incorporated by reference in its entirety.

BACKGROUND OF THE INVENTION

Field of the Invention

The invention relates to a method for identifying the location of a fault on a faulty line of an electrical power supply network having a plurality of lines, a plurality of inner nodes, which each connect at least three lines to one another, and at least three outer nodes. Wherein the outer nodes each bound a line and are provided with measurement devices which are used to measure high-frequency current and/or voltage signals. In the method, after a fault has occurred on the faulty line, measurement devices are used to detect respective times at which traveling waves arrive at the outer nodes on the basis of the measured high-frequency current and/or voltage signals, and the fault location is identified using the detected times.

The invention also relates to a device for carrying out such a method.

The safe operation of electrical power supply networks requires quick and reliable detection and disconnection of possible faults, for example short circuits or ground faults. Causes of faults which bring about disconnection may be, for example, lightning strikes, ruptured or otherwise damaged lines, faulty insulation in cable lines or the undesirable touching of overhead lines with parts of animals or plants. In order to shorten downtimes caused by faults, such faults must be located as accurately as possible in order to make it possible for the cause of the fault and any possible consequential damage caused by the fault to be eliminated by a maintenance team.

The location at which the fault is situated on the line can be narrowed down by analyzing measurement variables, for example currents and voltages, which are captured while a fault occurs. A plurality of different methods have become known for this purpose in the meantime, the accuracy of which has a significant effect on the amount of maintenance effort for the power supply network. Therefore, great importance is attached to improving the accuracy of the algorithms used to locate faults in order to facilitate maintenance and, in particular, shorten downtimes of the power supply network which are caused by faults.

Methods for more accurately locating faults use, for example, the measured current or voltage signals of the fundamental wave (50 Hz or 60 Hz signals) to locate faults. Methods which use measured values from only one of the line ends (single-ended fault location) or measured values from both line ends (double-ended fault location) are known in this case. As the result, the fault location is generally stated as a distance from the respective measurement point (in percentage of the line or in km or miles). If measured values from only one line end are used, the effort needed to locate faults is low. This fault locating method is predominantly an impedance-based method in which an impedance up to the fault location is calculated from measured current and voltage values. A conclusion with respect to the fault location can be drawn by means of a comparison with the line impedance of the entire line in the fault-free case. An exemplary embodiment of such a fault locating method can be gathered, for example, from the U.S. Pat. No. 4,996,624.

Improved accuracy when locating faults can be achieved by using measured values from both line ends. In this case, the measured values based on locating faults must be combined via a suitable communication connection. In this context, reference is made to the U.S. Pat. No. 5,929,642; in the method described there, a very high degree of accuracy (measurement error of approximately 1-2%) is achieved when locating faults by using measured current and voltage values from both line ends with the aid of estimation methods and non-linear optimization methods.

Whereas the accuracy with which faults are located in the impedance-based fault locating methods depends on the measurement accuracy of the measurement transducers used and the nature of the network, a high degree of independence from these variables can be achieved by using a fault locating method according to the so-called traveling wave principle ("traveling wave fault location"). According to this principle, instead of the fundamental waves of the measured current and voltage signals, the high-frequency signal components which are produced during the fault and occur in the form of so-called "traveling waves" are taken into account for the purpose of locating faults. In this case, the high-frequency traveling wave edges are captured using metrology and are provided with a time stamp. Since the propagation speed of the traveling waves is approximately the speed of light, the fault can be located well from the evaluation of the time stamping. Accuracies in the range of a few dozen meters can be achieved with this fault locating method. One example of such a fault locating method can be gathered from the U.S. Pat. No. 8,655,609.

Another method for locating faults using traveling waves, in which pattern recognition of relatively long temporal profiles of current and/or voltage is carried out instead of the edges, is also known, for example, from the European patent application European EP 3193420 A1 (corresponding to U.S. Pat. No. 10,598,717).

The fault locating methods mentioned are particularly suitable for linear network topologies without branches, that is to say for lines having two line ends. However, rapid integration of regenerative energy sources in, and the expansion of, existing power networks in many situations require the construction of network topologies which differ from a conventional linear structure. In this case, branched structures which can be interpreted as a combination of a plurality of tripod structures (or T structures) having more than two line ends (outer nodes) and a plurality of inner branching points (inner nodes) are often created. These are also hugely popular for economic reasons. Such structures—even in comparison with the linear network topology—often constitute the only practical alternative for necessary network expansion. The number of power supply networks which at least partially have the branched structures described is therefore increasing.

However, such branched structures of the network topology constitute a great challenge from the point of view of network management, network monitoring and network protection. In particular, in complex branched structures, incorrect reactions of protection devices may occur, with the result that correct disconnection of the affected line section can no longer be ensured in the event of a network fault, for example. In addition there are also difficulties when locating the fault in such network structures, with the result that the results of a fault locating process are often uncertain, which results in considerable effort when maintaining the lines.

In addition, in a branched power supply network, inner nodes are usually not directly monitored using metrology. This is because it is often not possible to install a fault locating device at such inner nodes in power supply networks, in particular, since there is no possibility for installing devices on the branching masts (no transducers, no auxiliary voltage, no space for installing devices). Therefore, the known methods for double-ended fault location are not suitable for these applications since it would also be necessary here to install devices on the inner node. Therefore, there is no direct possible way of inferring the status of network operation or reacting using protection technology at such a node.

Nowadays, faults are often also located in branched network topologies according to conventional methods. The above-described method of single-ended fault location according to the impedance principle is predominantly used. Since at least three line ends are involved, three results are generated for the fault location. However, only one of the results can be correct. This procedure does not provide any guarantee of the correct fault location being found. Double-ended fault location may also provide an uncertain result. This is associated with the fact that a fault is not disconnected at the same time in each section and a relatively highly transient state is produced thereby. Accordingly, the accurate determination of a phasor as a basis for locating faults is a very great challenge.

Published, European patent application EP 3660523 A1 discloses a method for locating faults in a branched power supply network having more than two ends, in which transient current and voltage profiles are first of all calculated for each node in the network for the purpose of locating faults. This information is then used to determine the fault location on a line in the network by means of a traveling wave algorithm. This makes it possible to locate faults with a high degree of accuracy even in a branched power supply network.

BRIEF SUMMARY OF THE INVENTION

The invention is based on the object of specifying an alternative method for locating faults in a branched power supply network, which method can be carried out using means which are as simple as possible.

This object is achieved by means of a method of the type stated at the outset, in which one of the outer nodes is selected as the starting node for the search for the fault location, starting from the starting node, paths to the other outer nodes are determined, which comprise a plurality of lines and inner nodes, and those paths on which the fault location could be located, in principle, are selected, a line on which the fault location could be located, in principle, is identified for each of the selected paths using the respective times at which the traveling waves arrive, and a potential fault location is determined for the respectively identified line.

In the procedure proposed here, elements of graph theory are advantageously linked to the fault locating process. For this purpose, paths through the power supply network are formed starting from the starting node and a fault locating process is carried out for each of the paths. Faults can be located using simple metrological and communication-related means by applying the proposed method since, on the one hand, the traveling waves must be captured and time-stamped only at the outer nodes and, on the other hand, only the identified times—and therefore a small volume of data—must be transmitted to a fault locating device for the purpose of determining the fault location.

In addition, traveling wave fault location may be characterized, in principle, by many advantages. One of the advantages is the omission of the need to calculate a phasor for the nominal frequency. Phasor-based methods are not always reliable when locating the fault, in particular in the case of very short disconnection times of a network fault. For this reason, traveling wave fault location is used in the present invention. This requires only an item of information relating to the times at which the respective traveling wave has arrived at the outer nodes. On account of the speed of the proposed method, it can also be used, in principle, to detect and disconnect faults and not only to locate faults.

In this case, the measurement devices may capture the high-frequency signals, for example, at a sampling frequency above the fundamental frequency of the signals, preferably at a sampling rate of between 8 kHz and 64 kHz. This makes it possible to ensure that the high-frequency transient signals can be correctly captured and processed further. In this case, higher sampling rates are to be preferred, in principle.

According to one advantageous embodiment of the method according to the invention, provision is made for the actual fault location in the power supply network to be determined by comparing the potential fault locations of at least two selected paths.

As a result, a plausibility check is carried out in order to determine the actual result of the fault locating process. This may be necessary, in particular, in meshed networks.

A further advantageous embodiment of the method according to the invention provides for that outer node at which a traveling wave has first been detected to be selected as the starting node.

The fault locating process can therefore be carried out starting from a clearly defined starting point. It is also possible to ensure that the fault location is located as close as possible to the starting node.

A further advantageous embodiment of the method according to the invention provides for the power supply network to be mapped to at least one tree structure in order to identify the paths.

This makes it possible to provide a structure which can be easily processed and in which a search can be carried out for the faulty line. For this purpose, only each path of the tree structure needs to be processed when locating faults.

Specifically, in this context, provision may be made for a minimum tree to be identified by means of Kruskal's algorithm during mapping.

Kruskal's algorithm is an algorithm which is known from graph theory for identifying that tree with the lowest path weight. In the present case, the total length of the lines of a path or the propagation time of a traveling wave over all lines of the path can be considered to be the path weight, for example.

Specifically, in this context, provision may also be made for the minimum tree and at least one further, non-minimum tree to be identified in a power supply network having at least one mesh.

In this case, a partial structure of the power supply network, the start and end nodes of which are identical, is considered to be a mesh. On account of meshing, the branched structure cannot be completely mapped in a single tree, with the result that a further (non-minimum) tree must be generated in addition to the minimum tree for each mesh in order to take into account all lines when locating faults.

In order to select those paths on which the fault location could be located, in principle, a further advantageous embodiment of the method according to the invention provides for a time difference between the times at which the traveling waves arrive at the outer nodes of the respective path to be determined, and for those paths whose time difference is less than a total propagation time of a traveling wave over the respective path to be selected.

This makes it possible to ensure, with a simple computational consideration, that only those paths on which the fault may also be actually located are taken into account when locating faults. This is because, if the fault is located anywhere on the line, the time difference may correspond at most to the total propagation time over the path. This extreme situation is present when the fault has occurred in one of the outer nodes. If the time difference for a path under consideration is consequently greater than the total propagation time of a traveling wave over this path, the fault must inevitably be located outside this path.

According to a further advantageous embodiment of the method according to the invention, provision may also be made for the line of the path on which the fault location could be located to be iteratively checked for each selected path on the basis of a virtual time difference, wherein the propagation times of a traveling wave from a node of the path selected for the iteration to a respective outer node of the path are used to form the virtual time difference.

In this context, iteratively means that, starting from the starting node, a check is first of all carried out, for a first line of the path which is bounded by the starting node and the next inner node, in order to determine whether the fault could be located on this line. If this is not the case, the region under consideration is respectively extended by the line up to the next inner node in each case until finally the outer node of the path has been reached as the end of the iteration.

In this context, in order to specifically determine the fault location, provision may be made, for a line on which the fault location could be located, in principle, for the potential fault location on the line to be determined on the basis of the times at which the traveling waves have arrived at the outer nodes of the path under consideration and the propagation times of the traveling waves over lines of the path under consideration which are not affected by the fault.

In this manner, after identifying which line is affected by the fault, the specific fault location on the line is determined by means of a double-ended traveling wave algorithm which has been corrected by the propagation times of the traveling waves over lines which are not faulty. For this purpose, only the propagation times of the traveling waves over the lines which are not faulty need to be calculated.

Specifically, in order to verify the fault location, provision may be made for that location which is indicated by most potential fault locations to be selected as the actual fault location. Therefore, an actual fault location can be determined even in the case of differing results for the potential fault locations.

A further advantageous embodiment of the method according to the invention provides, in a power supply network having at least one mesh, for a tree structure of the power supply network to be broken down into two subtrees, and for the potential fault locations to be identified on the basis of the times at which the traveling waves arrive at the outer nodes of the respective subtrees.

In this case, the section through the tree may be respectively effected by that line which is assumed to be faulty.

Finally, a further advantageous embodiment of the method according to the invention provides, with knowledge of the actual fault location, for a check to be carried out in order to determine whether the faulty line is an overhead line or an underground cable, and for an automatic restart function of a switch that interrupts a fault current to be enabled in the case of an overhead line, and for the automatic restart function to be blocked in the case of an underground cable.

This makes it possible to use the speed of the proposed method to also perform protection-related functions, in the present case the enabling or blocking of an automatic restart function, in addition to locating faults. Since faults on lines are often of a short duration, prompt continued operation of the power supply network can be ensured by automatically restarting the line after it has been disconnected. However, a fault is automatically eliminated only on overhead lines; underground cables are usually not affected thereby. Therefore, before an automatic restart, it is necessary to check whether the fault is located on an overhead line or on an underground cable. This information may be gathered from a topology description with knowledge of the faulty line.

The above-mentioned object is also achieved by means of a device for identifying the location of a fault on a faulty line of an electrical power supply network having a plurality of lines, a plurality of inner nodes, which each connect at least three lines to one another, and at least three outer nodes, wherein the outer nodes each bound a line. Wherein the device has an evaluation device which is configured to detect respective times at which traveling waves arrive at the outer nodes after a fault has occurred on the faulty line and to identify the fault location using the detected times.

The invention provides for the evaluation device to be configured to select one of the outer nodes as the starting node for the search for the fault location and, starting from the starting node, to determine paths to the other outer nodes, which contain a plurality of lines and inner nodes, and to select those paths on which the fault location could be located, in principle, for the evaluation device to be configured to identify a line on which the fault location could be located, in principle, for each of the selected paths using the respective times at which the traveling waves arrive, and to determine a potential fault location for the respectively identified line, and for the evaluation device to be configured to determine the actual fault location in the power supply network by comparing the potential fault locations of all selected paths.

With regard to the device according to the invention, all statements made above and below with respect to the method according to the invention and vice versa apply accordingly; in particular, the device according to the invention is configured to carry out the method according to the invention in any desired embodiment or in a combination of any desired embodiments. With respect to the advantages of the device according to the invention, reference is also made to the advantages described with respect to the method according to the invention.

With respect to the device, provision may be made, for example, for the device to have a measurement device which is used to measure high-frequency current and/or voltage signals at one of the outer nodes.

In this case, the device is provided at one of the outer nodes and receives information relating to the times at which the traveling wave arrives at the other outer nodes from measurement devices at the other outer nodes. It is possible for only one such device to be provided in the power supply network. In a manner differing from this, it is also possible for such a device to be provided at a plurality of or all outer nodes. Such devices then interchange information relating to the identified times with one another and calculate the fault location in a redundant manner.

Alternatively, provision may also be made for the device to be a separate data processing device and to be configured to receive high-frequency current and/or voltage signals from external measurement devices and to determine respective times at which traveling waves arrive at the outer nodes or to receive respective times at which traveling waves arrive at the outer nodes, as determined by means of the external measurement devices themselves.

In this case, the measurement devices for measuring the high-frequency signals and the device for locating faults are separate devices. The measurement devices transmit the times determined by them or their captured measured values directly to the separate device for further evaluation.

Specifically, in this context, provision may be made for the device to be a cloud data processing device.

This may be a platform for providing cloud services, on which an application ("app") for locating faults is installed. The platform may be, for example, Siemens Mindsphere©.

The invention is explained in more detail below on the basis of an exemplary embodiment. The specific configuration of the exemplary embodiment should not be understood as being restrictive in any way for the general configuration of the method according to the invention and of the device according to the invention; rather, individual configuration features of the exemplary embodiment can be freely combined with one another and with the features described above in any desired manner.

Other features which are considered as characteristic for the invention are set forth in the appended claims.

Although the invention is illustrated and described herein as embodied in a method and a device for identifying the location of a fault on a line of an electrical power supply network, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
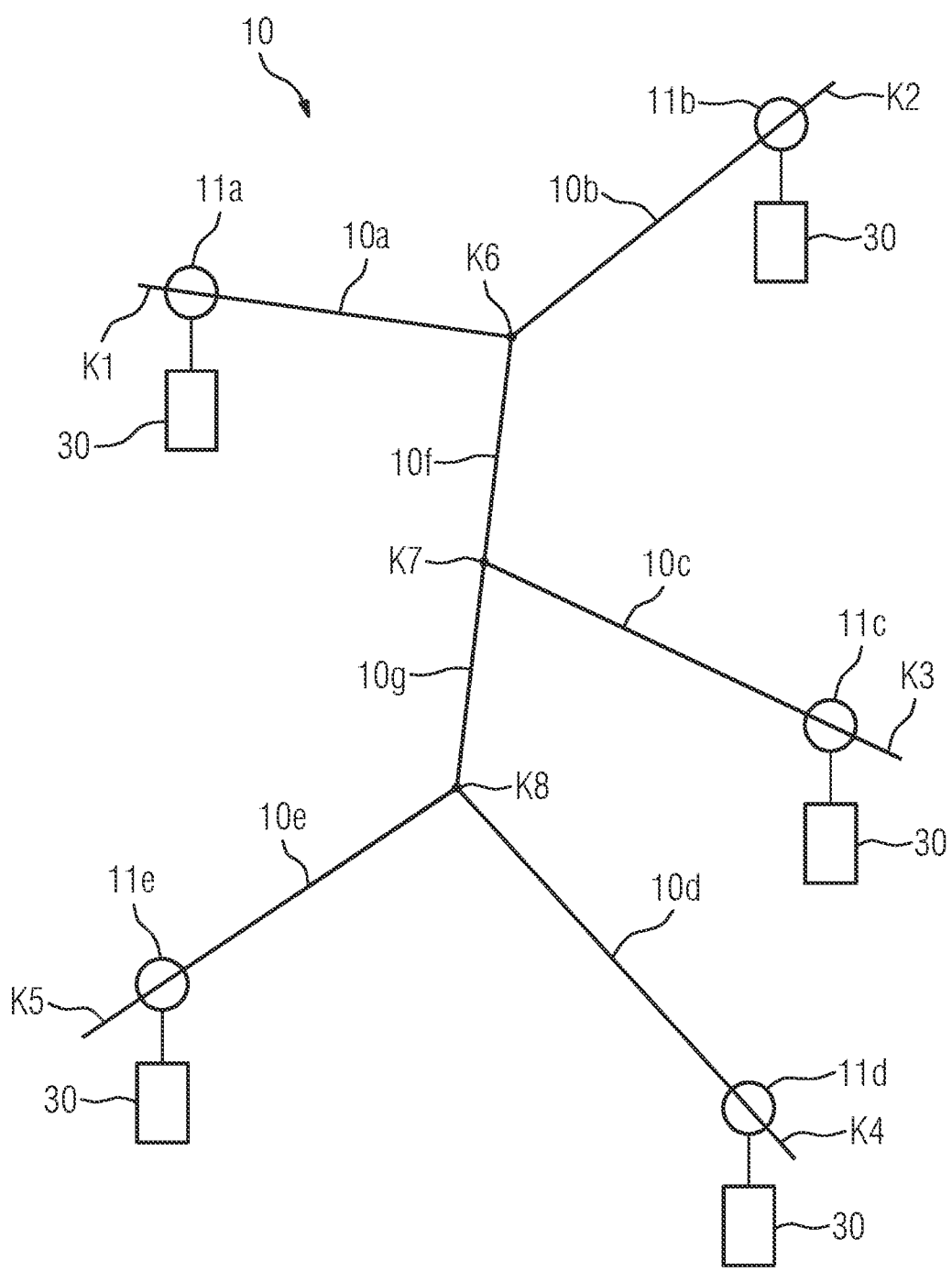
FIG. 1 is an illustration showing a branched power supply network.

Referring now to the figures of the drawings in detail and first, particularly to FIG. 1 thereof, there is shown a schematic view of a branched electrical power supply network 10. Although the power supply network 10 is illustrated as a single-phase network in FIG. 1, it may also have a multi-phase, in particular three-phase, design. The power supply network 10 contains a plurality of lines 10*a*-10*g*, outer nodes K1-K5 and inner nodes K6-K8. An outer node K1-K5 bounds an individual line, whereas at least three lines meet at an inner node K6-K8. Measurement points 11*a*-11*e*, at which currents and/or voltages are captured using suitable sensors and are forwarded to measurement devices 30, are provided at the outer nodes. In this case, the measurement devices 30 may be separate devices which are configured to measure high-frequency current and/or voltage signals. Alternatively, the measurement devices may also be part of devices for identifying a fault location. Such devices may be, for example, intelligent electronic devices (IEDs) in the form of electrical protection devices or fault locators.

It is also possible for the currents and/or voltages recorded at the outer nodes using the measurement devices 30 or information derived therefrom to be forwarded to a central device for identifying the fault location. This may be one or more separate computing devices or a cloud platform (for example the Mindsphere© Cloud from Siemens AG).

Figure 2:
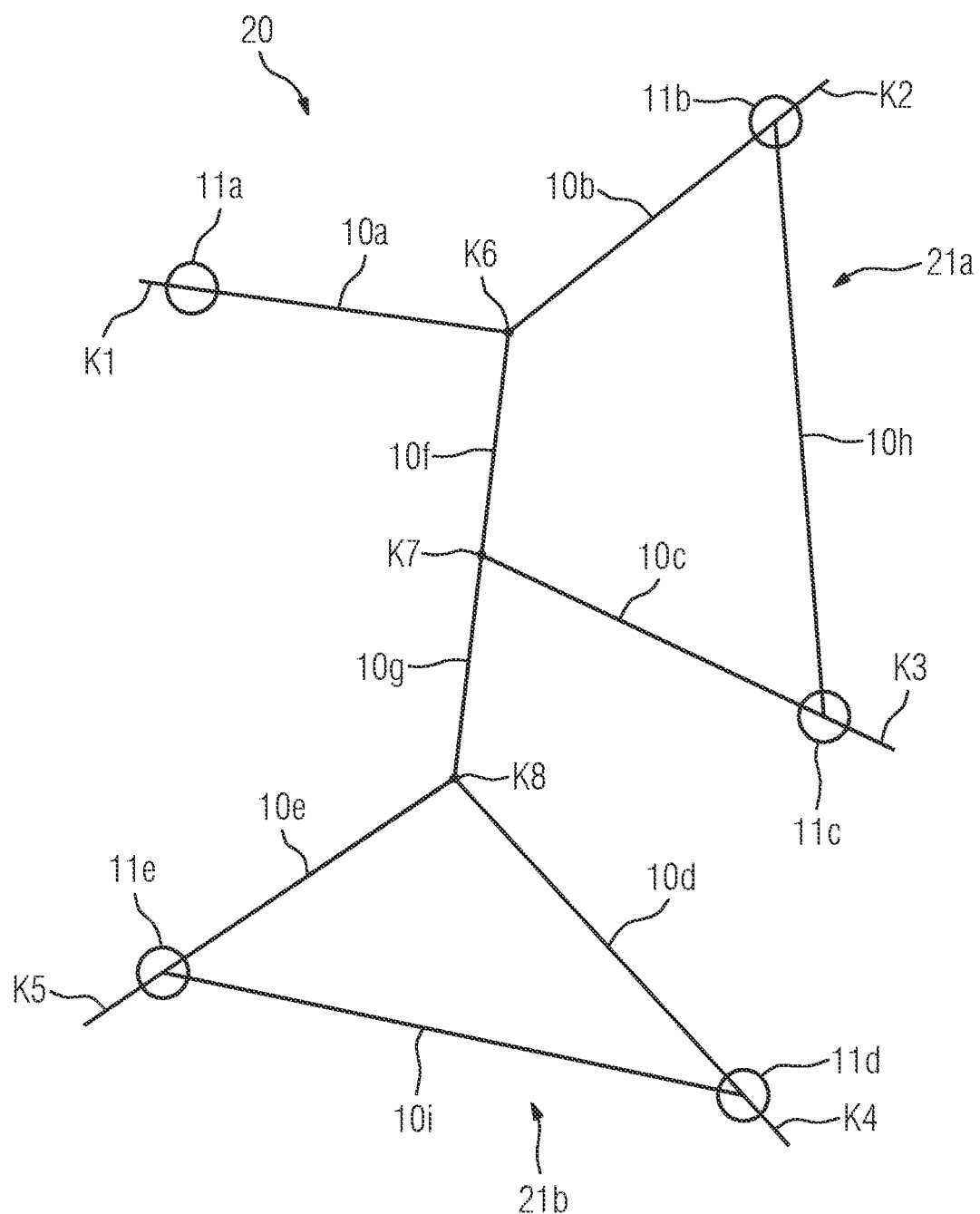
FIG. 2 is an illustration showing a further view of the branched power supply network having meshes.

FIG. 2 shows a modification of the power supply network 10 from FIG. 1. In addition to branches, the power supply network 20 in FIG. 2 also has meshes 21*a* and 21*b*. Such meshing may arise, for example, as a result of particular switch positions.

Branched and possibly even meshed network topologies have been increasingly used recently to handle the expansion of distribution networks for connecting decentralized energy generators (PV installations, wind turbines, cogeneration plants etc.), for example at the medium-voltage or low-voltage level. However, whereas fault detection and fault location determination can be carried out relatively easily using conventional single-ended or double-ended fault locating methods in lines having two line ends, the detection and localization of a fault in a branched topology are associated with greater difficulties. A method which can be used to accurately determine a fault location even in such branched network structures is presented below.

For this purpose, the invention uses the concept of traveling wave fault location. The determination of fault locations according to the principle of traveling waves considers high-frequency transient profiles in the measured currents and voltages after a fault has occurred in the power supply network. Such high-frequency signal components propagate in a wave-like manner from the fault location in all directions along the lines of the power supply network ("traveling waves"). The propagation along the line takes place at a known propagation speed, with the result that the fault location can be inferred on the basis of the arrival of the traveling wave at the line ends. Traveling wave fault location determination has a plurality of advantages. One of these advantages is that the need to calculate phasors for the nominal frequency is dispensed with. The practice of locating faults using transients provides more reliable results than phasor-based methods, in particular in the case of very short disconnection times of a network fault. Fault location determination using traveling waves also provides a more reliable result on account of the analysis of a broader frequency spectrum. This form of locating faults provides a high degree of reliability of the determined results, in particular in the case of resonant-grounded or isolated-neutral networks.

In addition, traveling wave fault location can also be used in networked and meshed topologies. In the examples shown in FIGS. 1 and 2, it is assumed that currents and/or voltages can be measured at the five outer nodes K1-K5. Measurement devices which can carry out signal sampling at a comparatively high sampling rate in the megahertz range should be used for the measurement. The reason for this is the need to record transients, that is to say high-frequency signal components, which cannot be recorded using conventional measurement devices at comparatively low sampling rates. The capture can be carried out, for example, using a fault recorder or a protection device. In the examples in FIGS. 1 and 2, it is also assumed that there are no measurement devices at the three inner nodes K6-K8, with the result that no currents and voltages can be captured there using metrology.

Figure 3:
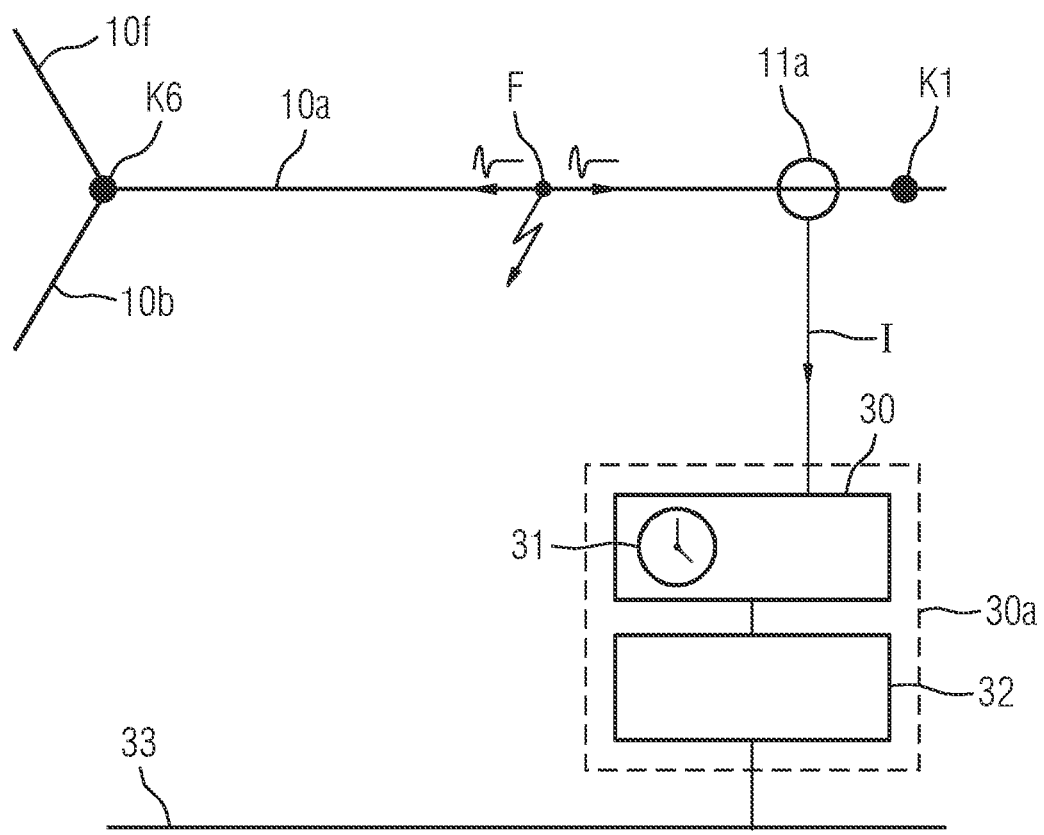
FIG. 3 is an illustration showing a line section having a device for determining a fault location.

FIG. 3 shows a basic arrangement for capturing traveling waves. In this respect, a fault F on the line 10a between the outer node K1 and the inner node K6 is assumed by way of example. High-frequency transient signals in the form of traveling waves propagate from the fault location in both directions along the line 10a. The high-frequency signals (current signals 1 are illustrated by way of example in FIG. 3, but voltage signals may also be alternatively or additionally used) are captured at the measurement point 11a arranged at the outer node K1 by means of a measurement device 30 and are identified there as a traveling wave. For this purpose, the measurement device operates at a high sampling rate in the megahertz range. The time at which the first edge of the traveling wave arrives is captured by the measurement device 30 using a highly accurate timer 31 and is stored.

In addition, the traveling wave also propagates from the fault location in the direction of the node K6 and propagates further in the power supply network from there via the lines 10b and 10f until it is captured at other outer nodes using metrology.

In this case, the measurement device 30 may be an independent device. As indicated in FIG. 3 by a dashed border, the measurement device may also, however, be part of a device 30a for identifying the fault location, which device 30a contains an evaluation device 32 which is used to locate faults, as described in detail below, on the basis of the information relating to the times at which the traveling wave arrives at all outer nodes of the power supply network. For this purpose, the device 30a is connected to a communication network 33, via which the information needed to locate faults is transmitted by the other outer nodes.

Figure 4:
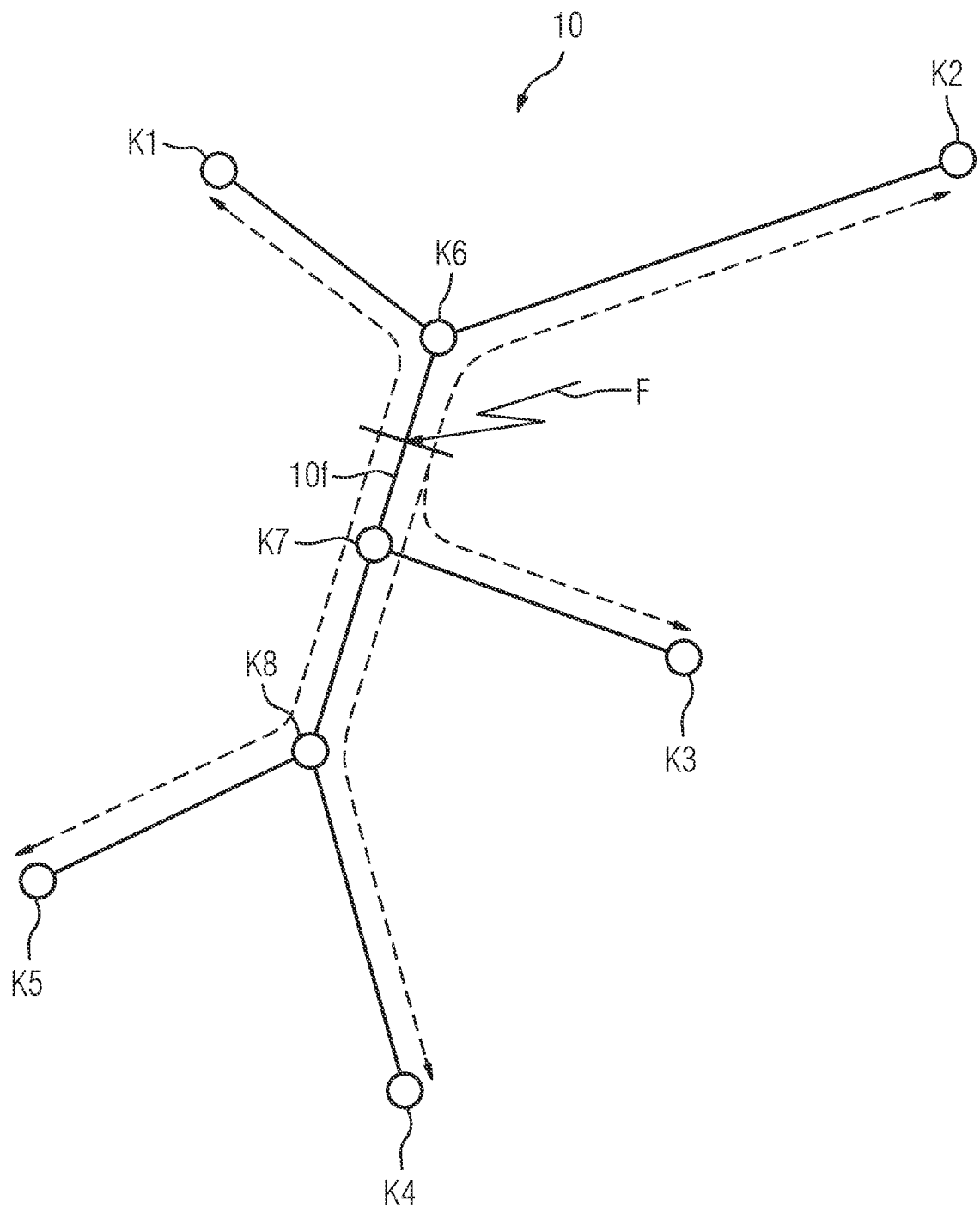
FIG. 4 is an illustration showing the power supply network from FIG. 1, in which a fault has occurred on a line.

FIG. 4 shows the power supply network 10 from FIG. 1, in which a fault F has occurred on the line 10f between the inner nodes K6 and K7. The propagation directions of the traveling waves arising at the fault location are indicated only schematically using dashed arrows. These traveling waves can be captured using metrology at the outer nodes K1-K5; the inner nodes K6-K8 do not have any metrology.

Figure 5:
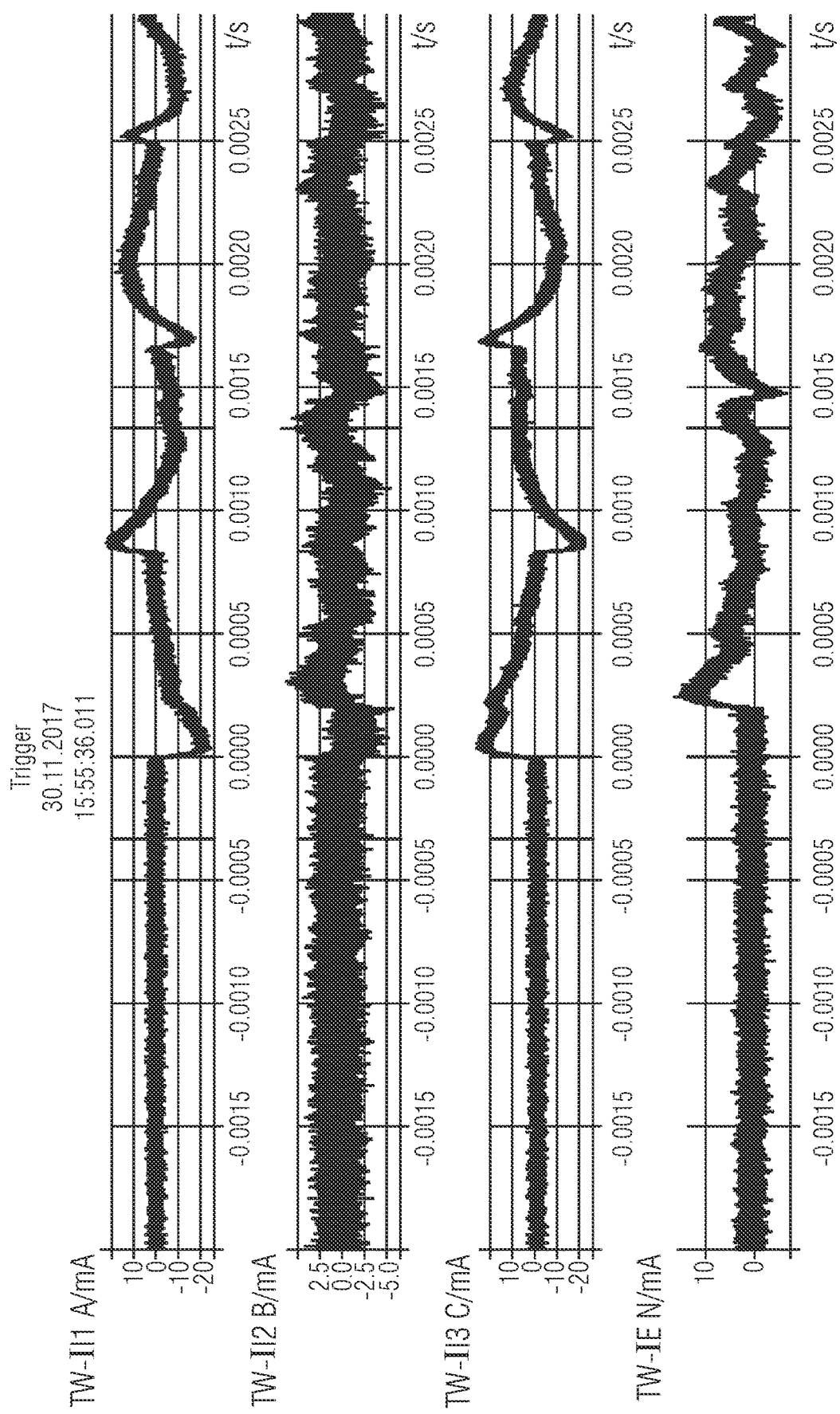
FIG. 5 are illustrations of exemplary profiles of high-frequency current signals at an outer node.

FIG. 5 shows, by way of example, the profile of (three-phase) current signals when the traveling wave arrives at the outer node K1. The profile illustrated by way of example was caused by a two-pole fault involving ground. Corresponding profiles can be captured at the other outer nodes. The occurrence of the first edge of the traveling wave triggers the assignment of a time at which the respective traveling wave arrives. The very accurate temporal resolution of the data can be seen. The trigger has an accuracy of a few hundred microseconds. The exact recording of the time is essential for the algorithm described below. In order to be able to locate faults, the times at which traveling waves arrive at the outer nodes K1-K5 must be captured exactly and transmitted to at least one evaluating device. The captured times can also be transmitted to a central station.

The nodes monitored using metrology are the nodes K1-K5. After a fault has occurred, each of these nodes provides its own time at which the respective traveling wave is captured; these times are denoted $t_1$, $t_2$, $t_3$, $t_4$ and $t_5$ on the basis of the numbering of the respective node. Faults are located on the basis of these times $t_1$-$t_5$.

A fault location $x_i$ as a distance from the node i can be determined by the following basic equation according to the traveling wave principle for a simple line having two ends:

$$x_i = \frac{l_i + \Delta t_{ij} v}{2}$$

where $l_i$ is the line length between nodes i and j, $\Delta t_{ij}$ is the measured time difference between the identified times at the nodes i and j, and v is the speed of the traveling wave.

In the case of a branched or meshed power supply network, the solution of this equation does not provide a correct result, however, since there is no clear line with two ends here and the network topology can change dynamically. The method described below is automatically adapted to the network topology which is present.

Figure 6:
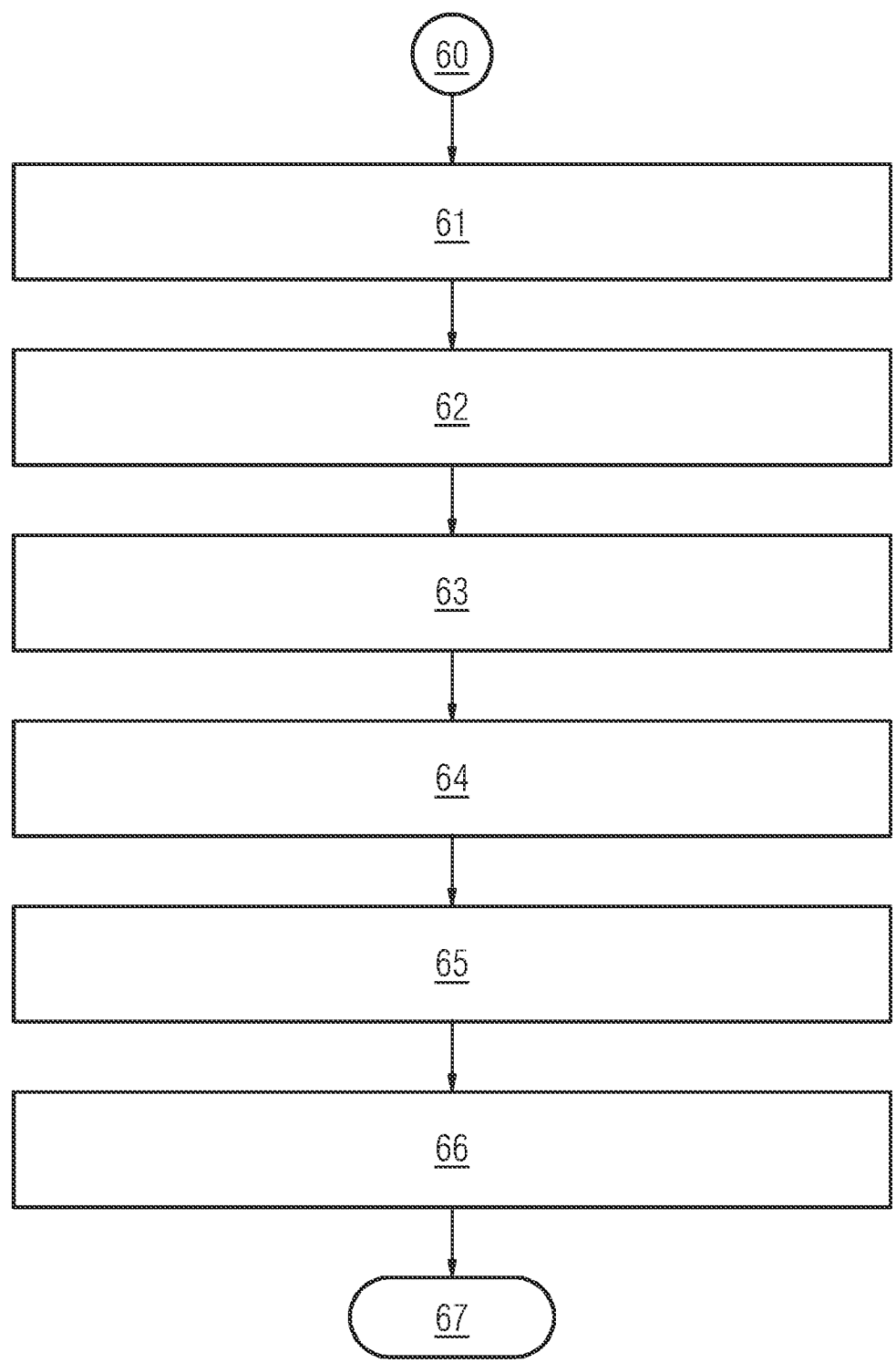
FIG. 6 is a schematic flowchart for explaining the basic procedure when determining a fault location.

The basic procedure is illustrated in the method sequence in FIG. 6. In a first step 60, the presence of a fault on one (unknown) of the lines 10a-g of the power supply network 10 is detected and the search for the fault location is initiated. In a subsequent step 61, one of the outer nodes K1-K5 is selected as the starting node for the search for the fault location. In the subsequent step 62, paths to the other outer nodes through the power supply network are formed starting from the starting node. In the subsequent step 63, those paths on which the fault could be located, in principle, are selected from the paths which are formed. For each of the paths selected in step 63, an iterative procedure is used in step 64 to identify a line on which the fault location could be located, and a potential fault location is subsequently determined in step 65 for the selected line. This is carried out for all selected paths, with the result that there is a plurality of potential fault locations after step 65. Finally, in step 66, the actual fault location is identified by comparing the potential fault locations and is output in step 67.

The individual steps are explained in detail below.

In step 60, monitoring is carried out continuously in order to determine whether a fault has occurred in the power supply network 10. Such detection can be carried out using generally known protection algorithms which make a decision as to whether a line of the power supply network 10 is in a faulty state on the basis of measured values captured at the outer nodes K1-K5. For example, a distance protection algorithm, a differential protection algorithm, an overcurrent protection algorithm or another protection algorithm can be used for this purpose. If a fault has not been detected in step 60, the continuous monitoring is continued. In contrast, if a fault has been detected, currents and/or voltages are captured at all outer nodes K1-K5 by means of high-frequency sampling and examined for the arrival of traveling waves. The times at which the traveling waves arrive are recorded. As a result of step 60, a time which indicates the arrival of the respective traveling wave at the relevant node is present for each outer node K1-K5.

In step 61, that node at which the corresponding traveling wave arrived first, that is to say which has the earliest time, is determined as the starting node for the search for the fault location. This node is closest to the fault location sought. In the present example, the outer node K1 is selected as the starting node.

In step 62, paths to the other outer nodes through the power supply network are formed starting from the starting node. For this purpose, the topology of the power supply network is advantageously mapped to a tree structure.

Knowledge from graph theory is used for this mapping of the network topology. In this case, the following definitions are used:

a network graph is a map of a network, to which N nodes K and $l_i$ lines (branches) are assigned;

a line $l_i$ (branch) connects two nodes $K_i$ and $K_j$ to one another;

a path is a collection of lines $l_i$ which connect two outer nodes to one another, wherein each node of the path occurs only once;

a mesh is a connection of lines $l_i$, in which the same node forms the start and the end; and a tree is a subgraph of a network, in which all nodes are present and no meshes occur.

Since the line on which the fault is located is initially unknown, the creation of a so-called network tree ("tree" for short) must be started. In the case of meshed systems (cf. FIG. 2), a plurality of trees can be created in order to be able to take into account all lines when locating faults. This variant is explained later. In the present case, the intention is to consider the branched network from FIG. 1 as an example.

In a first phase of step 62, the so-called "minimum tree" is first of all created as a map of the power supply network. The minimum tree connects all nodes to one another and has the lowest branch weighting overall. Either a line length or a propagation time of the traveling wave through the respective branch can be considered to be the branch weighting. The search for the minimum tree is advantageously carried out using Kruskal's algorithm. Starting with the lowest branch weighting, the tree is constructed in this case, step by step, around the branch with the respectively next lowest branch weighting. The search for suitable branches is advantageously carried out from those nodes which have already been integrated in the tree. The integration is carried out automatically by inserting the new branches. Those branches which would form a mesh are rejected when searching for suitable branches.

After the tree has been generated, the paths from the starting node K1 to the other outer nodes K2-K5 are formed in a further phase of step 62.

A recursion is advantageously used to determine the paths, in which, starting from the starting node, the respective next node in the path is identified by following the lines connected to the starting node. The following abort conditions are used when determining the paths:

the next node found is an outer node; and the next node found is already included in the path.

In this case, the entire path is rejected (a mesh has been found).

Figure 7:
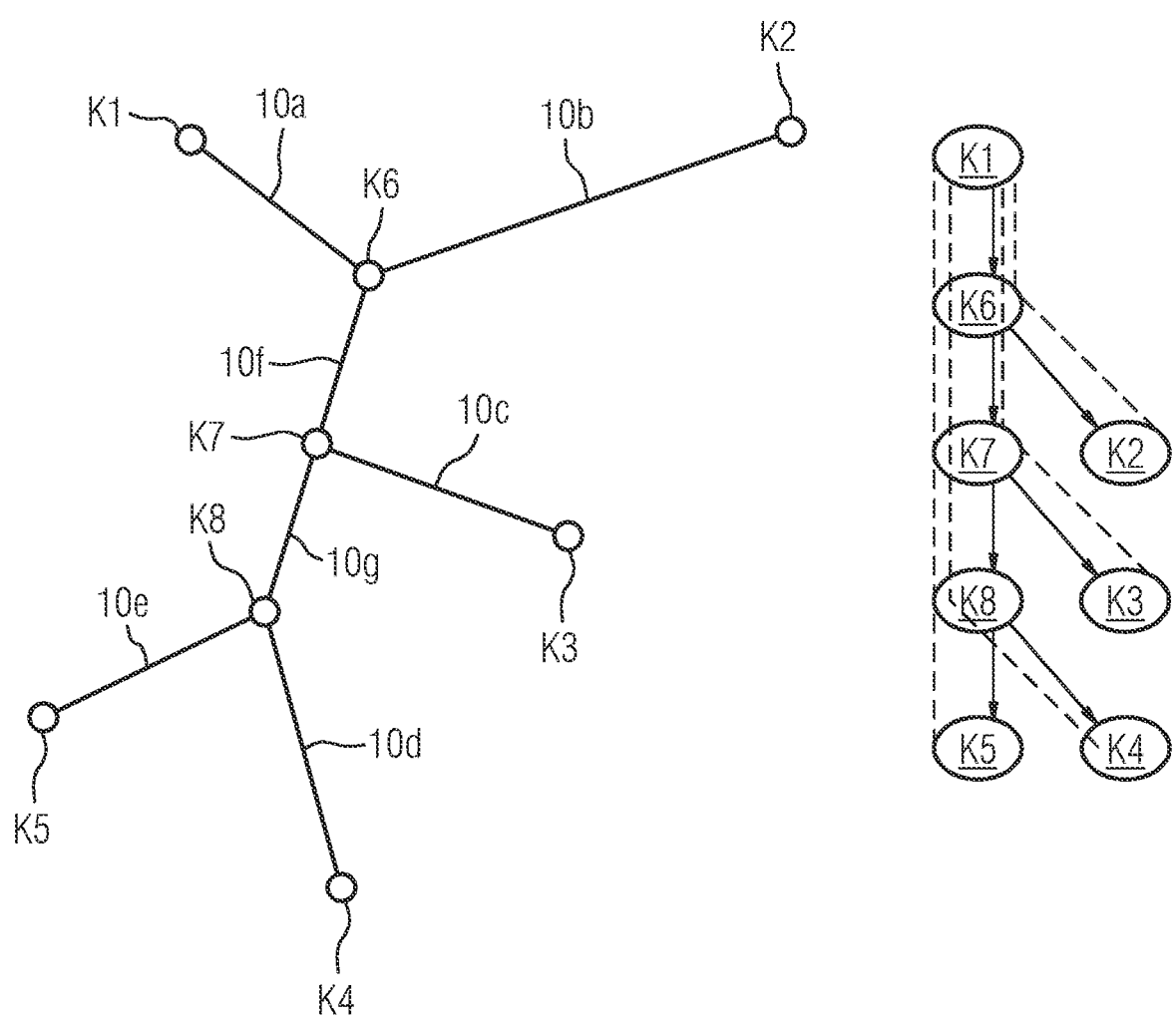
FIG. 7 is an illustration showing an example of a process of mapping the power supply network from FIG. 1 to a tree structure.

In the present example, the procedure for determining the paths takes place as described below. The stepwise identification of the paths is indicated on the right-hand side in FIG. 7.

a) Start at the starting node K1 (assumption: K1 is the node with the shortest absolute time of the detected wavefront);

b) insert line 10*a* from node K1 to the node K6;

c) insert line 10*b* from node K6 to the node K2;

d) abort reached for the first path K1-K6-K2 since K2 is an outer node;

e) insert line 10*f* from node K6 to the node K7;

f) insert line 10*c* from node K7 to the node K3;

g) abort reached for the second path K1-K6-K7-K3 since K3 is an outer node;

h) insert line 10*g* from node K7 to the node K8;

i) insert line 10*e* from node K8 to the node K5;

j) abort reached for the third path K1-K6-K7-K8-K5 since K5 is an outer node;

k) insert line 10*d* from node K8 to the node K4;

l) abort reached for the fourth path K1-K6-K7-K8-K4 since K4 is an outer node; and m) abort the identification of paths since there are no further paths to be followed.

After step 62, there is therefore a complete collection of paths which connect the starting node to other outer nodes.

In step 63, those paths on which the fault location could be located are selected from the paths. In this case, only those paths for which a traveling wave has been detected at both outer nodes and in which the time difference between the times at which the respective traveling wave arrives is less than or equal to the total propagation time of a traveling wave over the respective entire path are taken into account.

Therefore, the total propagation time of a traveling wave over the path is calculated for each path found using the known line lengths $l_i$ and the propagation speeds $v_i$ on the respective line $l_i$. On account of different line parameters (for example on account of the design as an overhead line or an underground cable), the propagation speeds vi may differ between the individual lines $l_i$. The total propagation time $t_{Pfad(Kn-Km)}$ for a path between the nodes Kn (starting node) and Km (respective outer node) is calculated as follows:

$$t_{Pfad(Kn-Km)} = \sum_{i=1}^{N} \frac{l_i}{v_i}.$$

In this case, N represents the number of lines on the path under consideration between the nodes Kn and Km, $l_i$ represents the length of the ith line in the path and $v_i$ represents the wave propagation speed on the ith line in the path.

Furthermore, the difference time $\Delta t_{Pfad}$ of the times at which the traveling waves arrive between the nodes Kn and Km at the start and at the end of the path is formed for each path. This time difference can be determined from the times $t_{Kn}$ and $t_{Km}$ which have been captured at the nodes Kn and Km:

$$\Delta t_{Pfad} = t_{Kn} - t_{Km}.$$

In order to determine whether the fault may be actually located on the path under consideration, the following condition must consequently be checked:

$$\Delta t_{Pfad} \leq t_{Pfad(Kn-Km)}.$$

If this condition is satisfied, the fault could be located on the path and the path is accordingly selected as a potentially faulty path. The described algorithm is carried out separately for all paths found in step 62. In this manner, the path K1-K6-K2 can be excluded in the present example since the fault cannot be located on this path.

Figure 8:
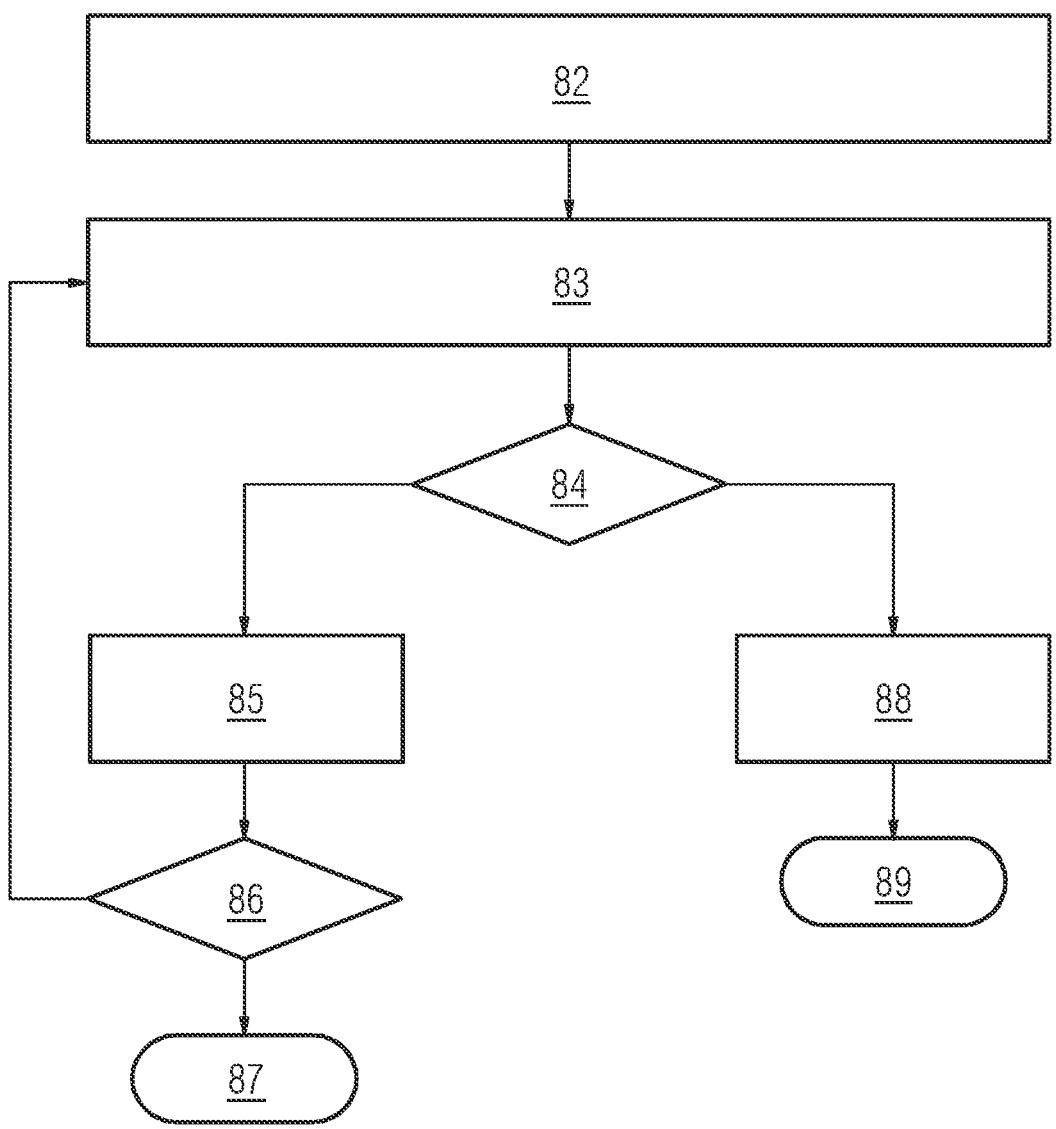
FIG. 8 is a further schematic flowchart for explaining the procedure when determining a potential fault location on a line.

In step 64, the respective line on which the fault could be located is identified in an iterative procedure for the selected paths. This procedure is explained in more detail with the aid of FIG. 8.

The processing begins with step 82 with the provision of the paths possibly affected by the fault according to the procedure explained above with respect to step 63.

In step 83, an iteration begins in which a virtual time difference $\Delta t_{Pfad,Kp}$ is first of all determined for the respective next node Kp on the path. Step 84 checks whether the time difference $\Delta t_{Pfad}$ determined for the path under consideration is greater than or equal to this virtual time difference:

$$\Delta t_{Pfad} \geq \Delta t_{Pfad,Kp}.$$

In this case, the virtual time difference is determined as the difference between the times at which the respective traveling wave has arrived at the respective node Kp under consideration sometimes starting from the starting node Kn and sometimes starting from the end node (the other outer node) Km:

$$\Delta t_{Pfad,Kp} = t_{Kp-Kn} - t_{Kp-Km}.$$

Whereas the time at which the traveling wave arrives has been captured using metrology at the starting node and at the end node and is therefore known, this is usually not known for the next node Kp, however, and must be computationally determined. The time results from the respective times $t_{Kn}$ (starting node) and $t_{Km}$ at the end node (at the remote outer node) of the path, which are known from measurement, taking into account the lines between these nodes and the node $K_p$ under consideration and the respective propagation speed:

$$t_{Kp-Kn} = t_{Kn} - \sum_{i=1}^{Nn} \frac{l_i}{v_i}$$

$$t_{Kp-Km} = t_{Km} - \sum_{i=1}^{Nm} \frac{l_i}{v_i}$$

where Nn is the number of lines between the starting node Kn and the node Kp under consideration and Nm is the number of lines between the end node and the node under consideration.

If it is determined in step 84 that the above-mentioned condition has not been satisfied, the method is continued with step 88 in which the line currently under consideration is identified as possibly faulty and a potential fault location on the line is calculated. The information relating to the potential fault location is provided in step 89.

In contrast, if the above-mentioned condition has been satisfied, the fault location is on the node Kp under consideration or is outside the currently investigated line of the path. The method is continued with step 85 in which the considered part of the path is extended by the line to the next node. If this next node has already been identified as an end node of the path (the outer node) in step 86, the method is terminated with step 87. The fault must then be located on the line which has been added last. In contrast, if the next node is not the end node of the path (a further inner node), a new pass of the iteration is started in step 83 and a virtual time difference $\Delta t_{Pfad,Kp}$ of a traveling wave is now calculated for the node Kp which has been added last. Step 84 then checks whether the time difference $\Delta t_{Pfad}$ is greater than or equal to this virtual time difference $\Delta t_{Pfad,Kp}$.

In the present example, for a considered path K1-K6-K7-K3 in the first pass of step 83, the inner node K6 is the next node Kp on the path starting from the starting node K1. It is therefore necessary to check whether the time difference $\Delta t_{Pfad}$ for the entire path is greater than or equal to the virtual time difference $\Delta t_{Pfad,K6}$ for the node K6:

$$\Delta t_{Pfad} \geq \Delta t_{Pfad,K6}$$

with $$\Delta t_{Pfad,K6} = t_{K6-K1} - t_{K6-K3}$$

In this case $$t_{K6-K1} = t_{K1} - \sum_{i=1}^{1} \frac{l_i}{v_i} = \frac{l_1}{v_1}$$

where the line 1 considered in this context, starting from node K1 in FIG. 1, has the reference sign 10*a*, and $$t_{K6-K3} = t_{K3} - \sum_{i=1}^{2} \frac{l_i}{v_i} = \frac{l_1}{v_1} + \frac{l_2}{v_2}.$$

where the line 1 considered in this context, starting from node K3 in FIG. 1, has the reference sign 10*c* and the line 2 considered in this context, starting from node K3 in FIG. 1, has the reference sign 10*f*.

In the present example, it is revealed, by checking the above condition, that the fault is not located on the first line 10*a*. Therefore, the next node on the path is selected in the next iteration. This is the node K7 in the present example. Since the condition $$\Delta t_{Pfad} \geq \Delta t_{Pfad,K7}$$

has not been satisfied for said node, the fault must be located on the line 10*f* added last between the nodes K6 and K7. If this were not the case, the iteration would have to be accordingly continued until the end of the path has been reached.

In order to determine the potential fault location on the line selected in step 88 (cf. also step 65 in FIG. 6), the propagation times of a traveling wave on the lines of the path which are not affected by the fault are first of all determined:

$$t_{Kp-Kn} = \sum_{i=1}^{Nn} \frac{l_i}{v_i}$$

$$t_{K(p+1)-Km} = \sum_{i=1}^{Nm} \frac{l_i}{v_i}$$

The faulty line is between nodes Kp and K(p+1). The propagation times are calculated, for the starting node, from Kn to the first node Kp bounding the faulty line and, for the end node, from Km to the second node K(p+1) bounding the faulty line.

For the faulty line found, a potential fault location is now determined using the following equation:

$$x_i = \frac{l_i + (\Delta t_{Pfad} - (t_{Kp-Kn} - t_{K(p+1)-Km})) \cdot v_i}{2}$$

In the present example, the fault is located between the nodes K6 and K7. The potential fault location therefore results according to the equation $$x_2 = \frac{l_2 + (\Delta t_{Pfad} - (t_{K6-K1} - t_{K7-K3})) \cdot v_2}{2}$$

In the present exemplary situation, this is the line 2 (reference sign 10*f*) having the length $l_2$ on the path K1-K6-K7-K3.

The described procedure is carried out for at least one of the selected paths. The result can be verified by comparing the results of a plurality of paths. In this case, that potential fault location which is indicated by most of the identified potential fault locations is determined as the actual fault location.

Since there may also be lines which are not included in the current path in the power supply network, the faulty line need not necessarily be situated on the current path. In this case, that node having the outgoing path to the faulty line is calculated as the fault location for the current path. If the determined potential fault location is therefore directly at one of the nodes in the range of the measurement errors, the fault location must in any case be verified using a further path. If all paths which contain the node determined as a potential fault location provide this network node as the fault location, the network node is the actual fault location. Otherwise, the fault location of the path which has determined a fault location on a line should be used as the fault location. If a potential fault location on a line and one or more potential fault locations at the node with the outgoing line to this line are therefore identified, the determined potential fault locations therefore indicate the fault location located on the line.

As described, the tree of wave propagation paths is always checked starting from the node with the shortest detected absolute time of arrival of the traveling wave (starting node). It is therefore ensured that this node is closest to the fault location and at least one path starting from this node contains the fault location.

If there is strong meshing of the power supply network (cf. FIG. 2), the network structure must also be mapped to further (non-minimal) trees in addition to the minimum tree in order to be able to take into account any possibility of a faulty line. This is because it can be easily determined when comparing the minimum tree in FIG. 7 and the network structure in FIG. 2 that not all lines (branches) are taken into account by the minimum tree. Lines 10*h* and 10*i* are missing.

For this reason, it is necessary to generate further trees which take into account the lines missing in the minimum tree. The further trees are likewise created according to Kruskal's algorithm with the difference that one of the branches which has not already been taken into account in the minimum tree is selected as the starting branch.

Figure 9:
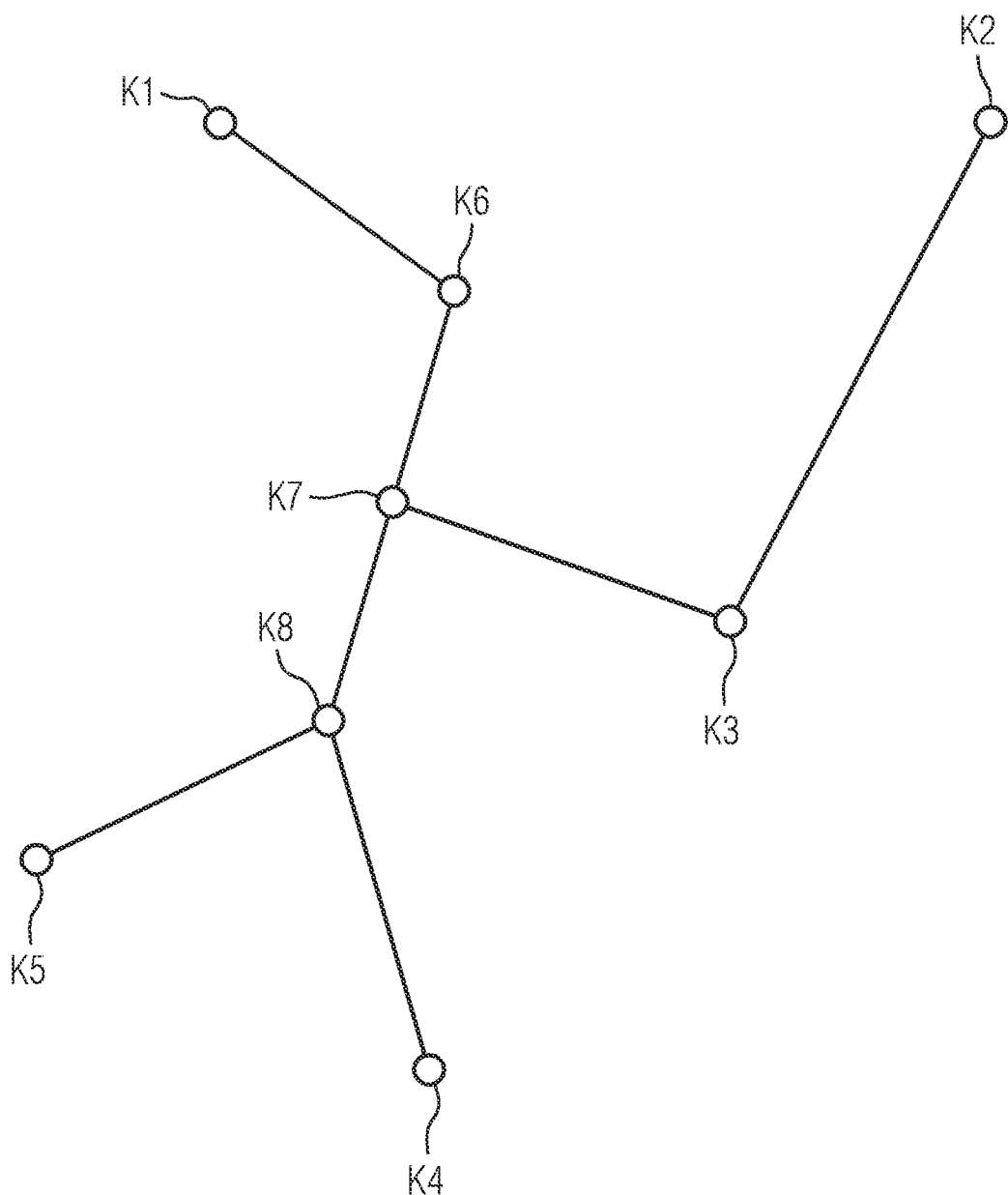
FIGS. 9-10 are illustration of further (non-minimum) trees as a mapping of the meshed power supply network from FIG. 2.
Figure 10:
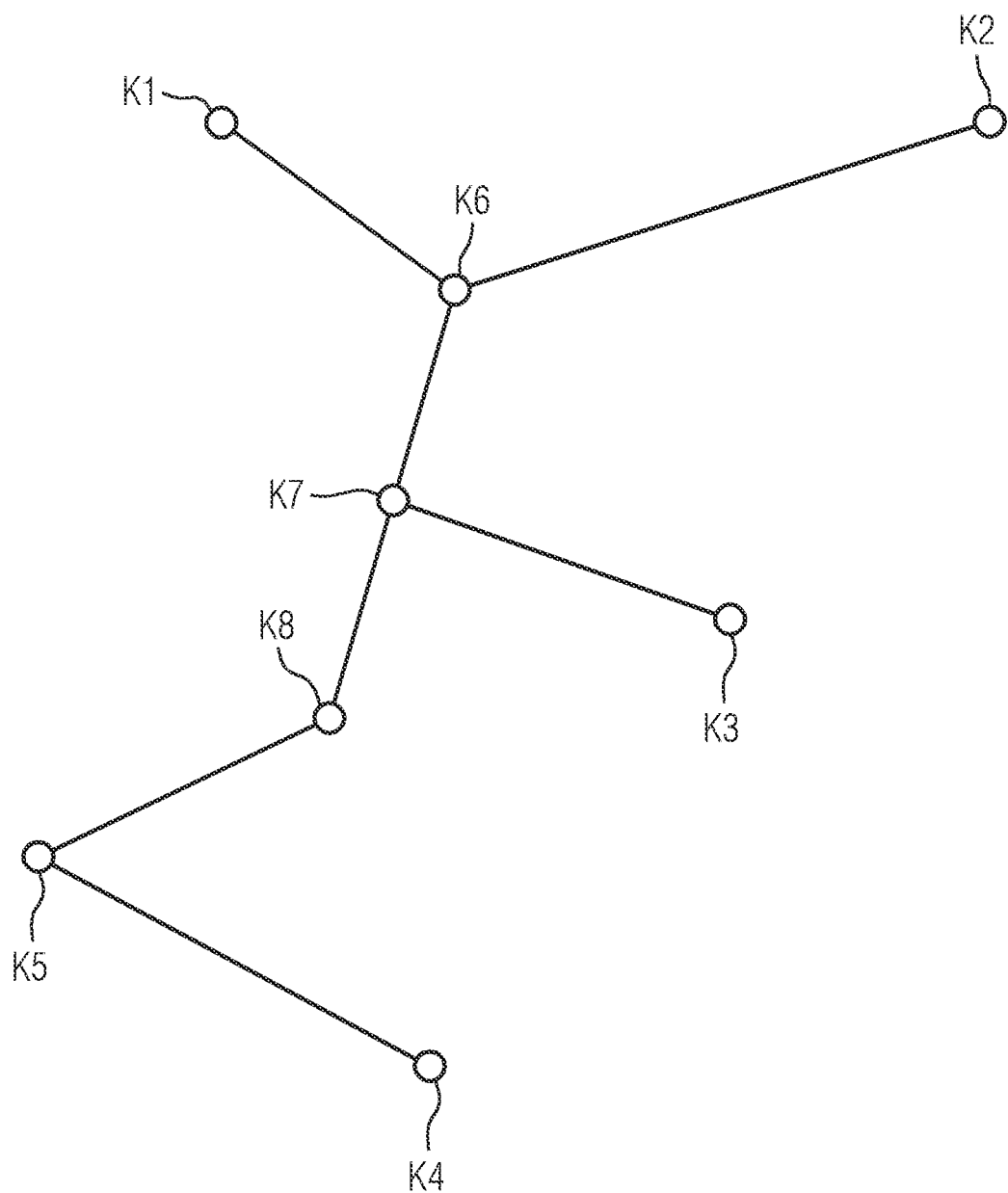

In the exemplary situation in FIG. 2, two further trees are therefore formed and are shown in FIGS. 9 and 10, with the result that three trees (the minimum tree according to FIG. 7 and the non-minimum trees in FIGS. 9 and 10) are available as the basis for locating faults.

Figure 11:
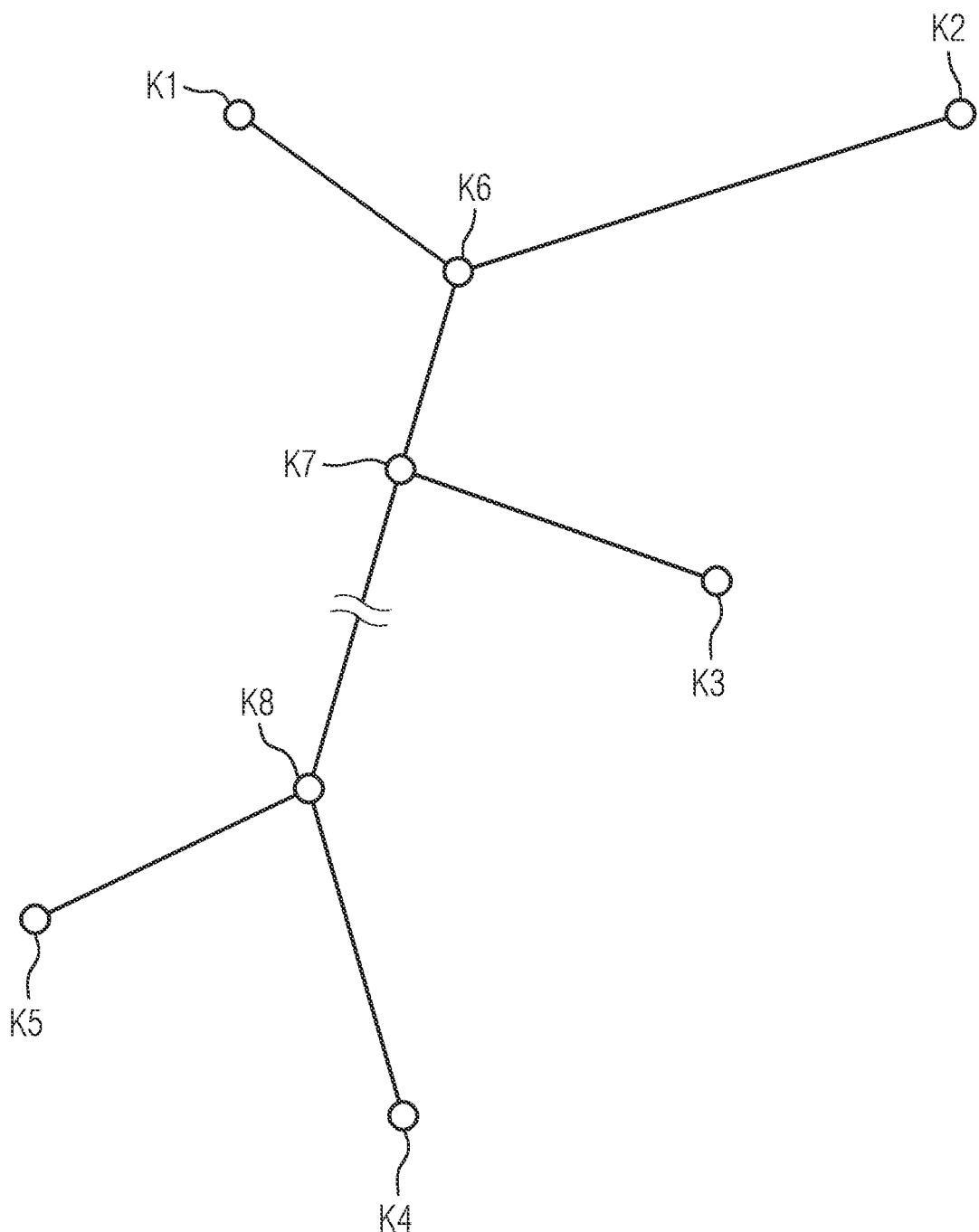
FIG. 11 is an illustration showing an exemplary division of a tree into two subtrees.

It is necessary to construct all tree structures in meshed networks for the flexible search for the fault location. Since the faulty line is not known, every line must be examined for the potential fault location. In order to assist this, a section through the respectively examined line can be made, with the result that two subtrees are formed. This is illustrated in FIG. 11.

The subtrees produced by the section have clearly defined paths for the traveling wave fault location according to the procedure described above. In order to locate faults, the times captured at the outer nodes of both trees are combined with one another and a path correction factor is additionally introduced. The path correction factor depends on the distance covered by the traveling wave. This distance can be read from the tree structure. In the present example, the locating process is carried out on line 7 (see section in FIG. 11) with the following equation:

$$x_7 = \frac{l_7 + [t_{K1} - t_{K7-K1} - (t_{K5} - t_{K8-K5})] \cdot v_7}{2}$$

The fault location can be calculated from all measured nodes of both subtrees that are combined with one another. The number of equations automatically results from the number of monitored nodes. In the present example, 6 equations {K4, K5}×{K1, K2, K3} can be created. Since this is an overdetermined system of equations with an unknown, the solution is provided by means of a trivial equation:

$$x_7 = \frac{l_7 + [t_{K1} - t_{K7-K1} - (t_{K5} - t_{K8-K5})] \cdot v_7}{2}$$

$$x_7 = \frac{l_7 + [t_{K1} - t_{K7-K1} - (t_{K4} - t_{K8-K4})] \cdot v_7}{2}$$

This system of equations presents solutions on the basis of the combinations of the times of the captured traveling waves between the nodes K1 and K5 and K1 and K4. In order to complete the result, the further combinations between the nodes can also be evaluated.

Since, in a meshed system, the line on which the fault has occurred is initially unknown, sections according to FIG. 11 must be carried out on each of the lines. The appropriate tree should be respectively selected for this purpose. In the case of a line which is not faulty, implausible results are provided.

In addition to purely locating faults, the method can also be used to assist protection functions on account of its high speed and accuracy. For example, after the faulty line has been detected, a check can be carried out in order to determine whether this line is an overhead line or an underground cable. For this purpose, a configuration database, for example, can be searched for a type of faulty line. The result of the check can then be used to control an automatic restart function. Since the majority of faults which have occurred in power supply networks are specifically independently eliminated again, it is possible to restart a switch opened for the purpose of fault current disconnection after a short time. This is carried out in an automated manner by an automatic restart function, but may usually be used only for overhead lines. In contrast, faults which have occurred in underground cables are often of a permanent nature, with the result that a restart cannot be carried out here. The result of the check described above can therefore be used to block (underground cable) or enable (overhead line) the restart.

Figure 12:
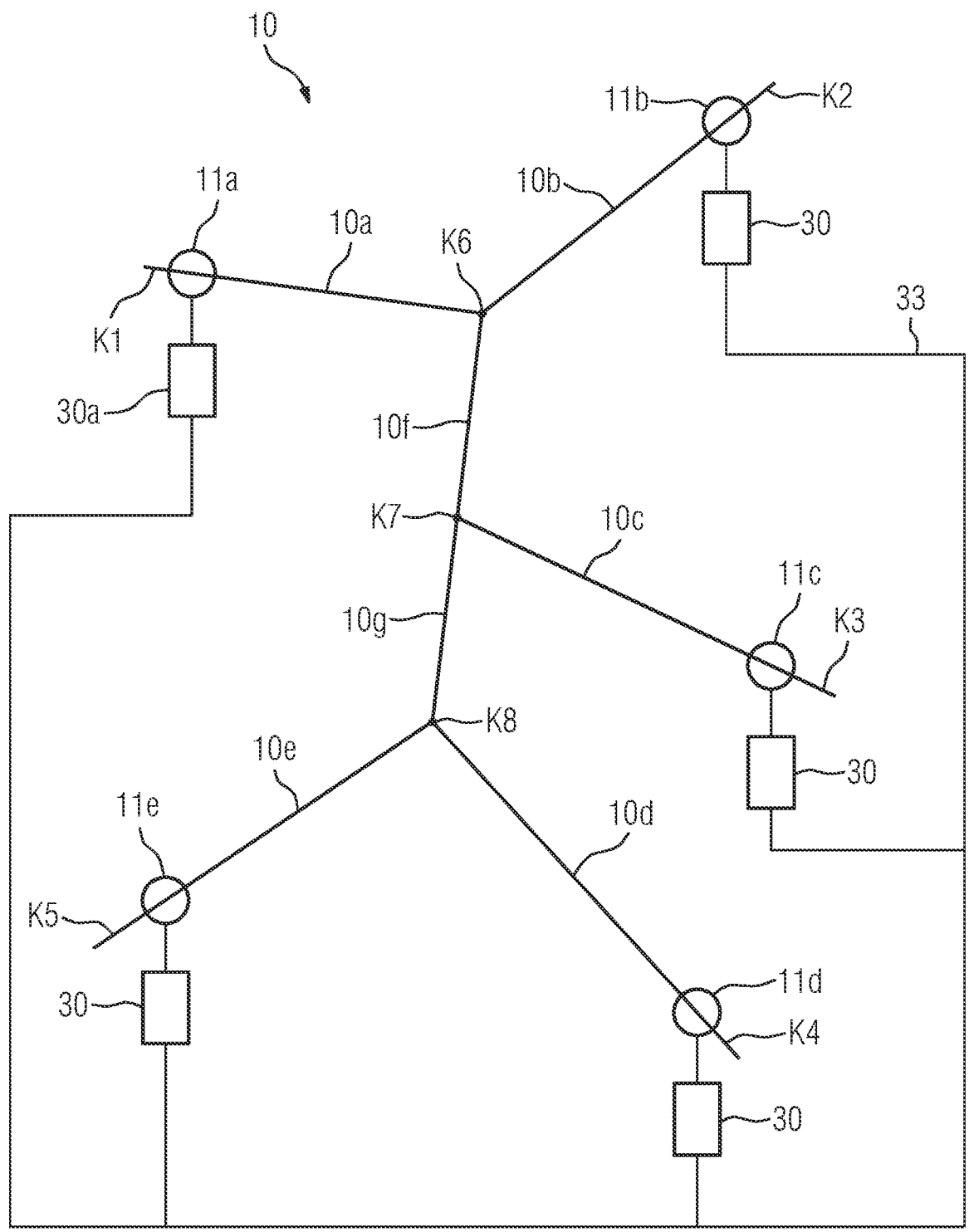
FIG. 12 is an illustration showing the power supply network from FIG. 1, in which information is transmitted between the measurement devices.
Figure 13:
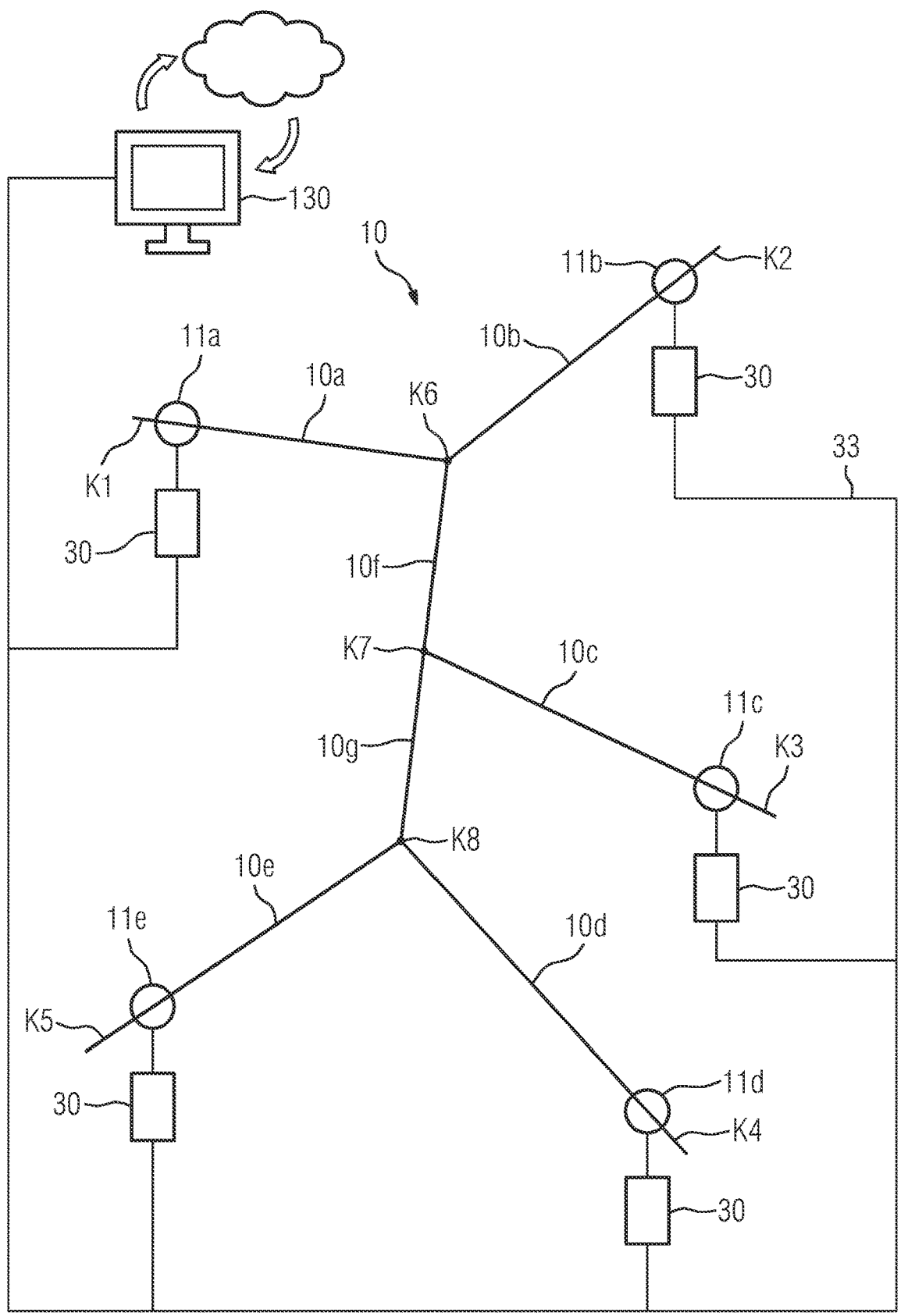
FIG. 13 is an illustration showing the power supply network from FIG. 1, in which information is transmitted from the measurement devices to a central data processing device.

FIGS. 12 and 13 finally show different architectures of a system for determining a fault location in a branched and possibly meshed power supply network.

In FIG. 12, the measurement devices 30 are connected to one another via a communication network 33 (cf. also FIG. 3) and transmit information relating to the times at which the traveling waves arrive or the measured current and/or voltage signals to a fault locating device 30a for further evaluation. The fault locating device 30a contains a measurement device 30 and an evaluation device which is used to carry out the fault locating method described above. Alternatively, more than one fault locating device 30a may also be provided.

In contrast, in FIG. 13, a central data processing device 130 is provided, to which the times at which the traveling waves arrive or the measured current and/or voltage signals are transmitted by the measurement devices for further evaluation via the communication network 33. Faults are then located in the central data processing device 130. The central data processing device may also be a cloud platform such as Siemens Mindsphere©.

A method which can be used to locate faults even in branched and possibly meshed power supply networks was described above. For this purpose, elements of graph theory were linked in an inventive manner to the principle of traveling wave fault location. This dispenses with the need to monitor all nodes in the power supply network using metrology, thus making it possible to save effort and costs.

Although the invention has been described and illustrated more specifically in detail above by means of preferred exemplary embodiments, the invention is not restricted by the disclosed examples and other variations can be derived therefrom by a person skilled in the art without departing from the scope of protection of the following patent claims.

The invention claimed is:

1. A method for identifying a location of a fault on a faulty line of an electrical power supply network having a plurality of lines, a plurality of inner nodes each connecting at least three of the lines to one another, and at least three outer nodes, wherein the outer nodes each bound a line and being provided with measurement devices being used to measure high-frequency current and/or voltage signals, which method comprises:

using the measurement devices to detect respective times at which traveling waves arrive at the outer nodes on a basis of the high-frequency current and/or voltage signals measured, after the fault has occurred on the faulty line;

selecting one of the outer nodes as a starting node for a search for the fault location;

starting from the starting node, paths to the other outer nodes being determined, the paths formed from the plurality of lines and the inner nodes, and the paths on which the fault location could be located, in principle, are selected;

mapping the electrical power supply network to at least one tree structure in order to identify the paths; and identifying, a line on which the fault location could be located, in principle, for each of the paths selected using the respective times at which the traveling waves arrive, and a potential fault location is determined for a respectively identified line.

2. The method according to claim 1, which further comprises determining an actual fault location in the electrical power supply network by comparing potential fault locations of at least two selected paths.

3. The method according to claim 1, which further comprises selecting an outer node of the outer nodes at which a traveling wave has first been detected as the starting node.

4. The method according to claim 1, wherein a minimum tree is identified by means of Kruskal's algorithm during the mapping.

5. The method according to claim 4, wherein the minimum tree and at least one further, non-minimum tree are identified in the electrical power supply network having at least one mesh.

6. The method according to claim 1, wherein:
in order to select the paths on which the fault location could be located, in principle, a time difference between times at which the traveling waves arrive at the outer nodes of a respective path is determined; and
the paths whose time difference is less than a total propagation time of a traveling wave over the respective path are selected.

7. The method according to claim 1, which further comprises iteratively checking the line of the path on which the fault location could be located for each selected path on a basis of a virtual time difference, wherein propagation times of a traveling wave from a node of the path selected for an iteration to a respective outer node of the path are used to form the virtual time difference.

8. The method according to claim 7, wherein for the line on which the fault location could be located, in principle, the potential fault location on the line is determined on a basis of times at which the traveling waves have arrived at the outer nodes of the path under consideration and the propagation times of the traveling waves over the lines of the path under consideration which are not affected by the fault.

9. The method according to claim 7, wherein the location which is indicated by most potential fault locations is selected as an actual fault location.

10. The method according to claim 9, wherein:
with knowledge of the actual fault location, a check is carried out in order to determine whether the faulty line is an overhead line or an underground cable; and
an automatic restart function of a switch that interrupts a fault current is enabled in a case of the overhead line, and the automatic restart function is blocked in a case of the underground cable.

11. The method according to claim 7, wherein:
in the electrical power supply network having at least one mesh, a respective selected path is broken down into two partial paths; and
potential fault locations are identified on a basis of the respective times at which the traveling waves arrive at the outer nodes of a respective partial path.

12. A device for identifying a location of a fault on a faulty line of an electrical power supply network having a plurality of lines, a plurality of inner nodes connecting at least three of the lines to one another, and at least three outer nodes, wherein the outer nodes each bound one of the lines, the device comprising:

an evaluation device configured to detect respective times at which traveling waves arrive at the outer nodes after the fault has occurred on the faulty line and to identify a fault location using the respective times detected;

said evaluation device being configured to select one of the outer nodes as a starting node for a search for the fault location and, starting from the starting node, to determine paths to other ones of the outer nodes, which contain a plurality of the lines and the inner nodes, and to select the paths on which the fault location could be located, in principle;

said evaluation device configured to map the electrical power supply network to at least one tree structure in order to identify the paths; and said evaluation device configured to identify a line on which the fault location could be located, in principle, for each of the paths selected using the respective times at which the traveling waves arrive, and to determine a potential fault location for a respectively identified line.

13. The device according to claim 12, further comprising a measurement device used to measure high-frequency current and/or voltage signals at one of the outer nodes.

14. The device according to claim 12, wherein the device is a separate data processing device configured to receive high-frequency current and/or voltage signals from external measurement devices and to determine the respective times at which the traveling waves arrive at the outer nodes or to receive the respective times at which the traveling waves arrive at the outer nodes, as determined by means of the external measurement devices themselves.

15. The device according to claim 14, wherein the separate data processing device is a cloud data processing device.

* * * * *